US010060145B2

(12) United States Patent
Hansort

(10) Patent No.: US 10,060,145 B2
(45) Date of Patent: Aug. 28, 2018

(54) LIFTING ANCHOR ASSEMBLY FOR PRECAST CONCRETE STRUCTURES

(71) Applicant: Midwest Concrete & Masonry Supply, Inc., Naperville, IL (US)

(72) Inventor: Marinus Hansort, St. Pete Beach, FL (US)

(73) Assignee: Midwest Concrete & Masonry Supply, Inc., Naperville, IL (US)

( * ) Notice: Subject to any disclaimer, the term of this patent is extended or adjusted under 35 U.S.C. 154(b) by 0 days.

(21) Appl. No.: 15/443,459

(22) Filed: Feb. 27, 2017

(65) Prior Publication Data

US 2017/0247232 A1 Aug. 31, 2017

Related U.S. Application Data

(60) Provisional application No. 62/301,135, filed on Feb. 29, 2016.

(51) Int. Cl.

*E04G 21/16* (2006.01)
*E04G 15/04* (2006.01)
*E04G 21/14* (2006.01)
*B66C 1/66* (2006.01)

(52) U.S. Cl.

CPC ........... *E04G 21/168* (2013.01); *E04G 15/04* (2013.01); *E04G 21/142* (2013.01); *B66C 1/66* (2013.01); *B66C 1/666* (2013.01); *H05K 999/99* (2013.01)

(58) Field of Classification Search

CPC .. B66C 1/66; B66C 1/666; E04B 1/04; E04G 15/04; E04G 21/142; E04G 21/168
See application file for complete search history.

(56) References Cited

U.S. PATENT DOCUMENTS 4,000,591 A * 1/1977 Courtois ............... B28B 23/005 52/125.4
4,367,892 A * 1/1983 Holt ........................ B66C 1/666 294/82.31
4,437,642 A * 3/1984 Holt .......................... B66C 1/66 249/175
4,580,378 A * 4/1986 Kelly .................... E04G 21/142 52/125.4
4,930,269 A * 6/1990 Kelly ...................... B66C 1/666 294/82.35
5,014,473 A * 5/1991 Kelly ...................... B66C 1/666 294/82.35

(Continued)

*Primary Examiner* — Andrew J Triggs
(74) *Attorney, Agent, or Firm* — Honigman Miller Schwartz and Cohn LLP

(57) ABSTRACT

A lifting anchor assembly that is configured to be embedded in a tilt-up concrete structure includes an anchor member that has a pair of legs extending downward from a central portion of the anchor member to form a generally inverted U shape. A spacer is disposed at a lower end portion of each of the pair of legs, where the spacers each include a plurality of spacing arms that extend radially at different lengths from an engagement portion of the spacer that adjustably attaches at the anchor member. The engagement portion of the spacer is configured to engage the anchor member in different rotational positions to selectively position one of the plurality of spacing arms in a downward position for accommodating different thickness dimensions of concrete structures.

19 Claims, 7 Drawing Sheets

(56) References Cited

U.S. PATENT DOCUMENTS

| | | | | |
|---|---|---|---|---|
| 5,094,047 | A * | 3/1992 | Kelly | E04G 21/142 52/125.5 |
| 5,226,265 | A * | 7/1993 | Kelly | E04G 21/142 294/82.35 |
| 5,588,263 | A * | 12/1996 | Kelly | E04G 5/04 52/125.4 |
| 6,279,274 | B1 * | 8/2001 | Amiet | E04C 5/168 52/125.2 |
| 6,341,452 | B1 * | 1/2002 | Bollinghaus | E04G 15/04 249/175 |
| D559,499 | S | 1/2008 | Scott et al. | |
| D569,071 | S | 5/2008 | Scott et al. | |
| 7,950,190 | B2 * | 5/2011 | Schulze | B28B 23/005 52/125.2 |
| 8,800,220 | B1 | 8/2014 | Francies, III | |
| 2002/0134905 | A1 | 9/2002 | Domizio | |
| 2010/0037536 | A1 * | 2/2010 | Schulze | B28B 23/005 52/125.4 |
| 2017/0247232 | A1 * | 8/2017 | Hansort | B66C 1/666 |

* cited by examiner

LIFTING ANCHOR ASSEMBLY FOR PRECAST CONCRETE STRUCTURES

CROSS-REFERENCE TO RELATED APPLICATION

The present application claims the filing benefit of U.S. Provisional Application, Ser. No. 62/301,135, filed Feb. 29, 2016, which is hereby incorporated herein by reference in its entirety.

FIELD OF THE INVENTION

The present invention generally relates to lifting anchors for tilt-up concrete structures, and more particularly to lifting anchors and assemblies for concrete walls, panels, and the like.

BACKGROUND OF THE INVENTION

Tilt-up precast concrete structures are often used in building constructions, and lifting anchors are commonly embedded or cast in the precast concrete structures to facilitate handling, since these structures can be difficult to hoist and handle due to their weight, bulkiness, and susceptibility to damage, such as cracking, chipping, and other breakage. However, lifting anchors are specific to particular structural thicknesses, and inventorying the many different types of lifting anchor components to accommodate different thicknesses can be expensive, time consuming, and generally a logistical nightmare.

SUMMARY OF THE PRESENT INVENTION

The present invention provides a lifting anchor assembly that is adapted to be embedded in tilt-up, precast concrete structures to provide an anchor or attachment point for a lift apparatus, such as a chain or cable or other device that is used to raise and support a concrete structure when positioning or otherwise moving the concrete structure. The lifting anchor assembly includes a clevis or anchor member that has a head or central portion configured to engage the lift apparatus and legs that extend downward at an angle from the central portion, such as to form an inverted U shape. The clevis or anchor member may include cross bars supported on or near lower ends of the legs. Spacers or feet are disposed at lower end portions of the legs, such as at the cross bars, where the spacers extend downward from the anchor member to rest on a lower surface of a concrete form for supporting the anchor member upright within a thickness of a concrete structure cast in the concrete form. The spacers may be adjusted to accommodate concrete structures with different thicknesses, such as by providing multiple spacing arms that extend radially at different lengths so that the spacers can engage the anchor member in different rotational positions that selectively position one of the spacing arms in a downward position that provides a corresponding desired spacing from the lower surface of the concrete form.

According to one aspect of the present invention, a lifting anchor assembly that is configured to be embedded in a tilt-up concrete structure includes an anchor member that has a central portion configured to engage a lift apparatus and a pair of legs that extend downward at an angle from the central portion. A plurality of spacers are disposed at lower end portions of the pair of legs, where the plurality of spacers each include at least one spacing arm that extends downward from the anchor member. A distal portion of the spacing arm is configured to rest on a lower surface of a concrete form to support the anchor member upright for being embedded within a thickness of a concrete structure cast in the concrete form.

According to another aspect of the present invention, a lifting anchor assembly that is configured to be embedded in a tilt-up concrete structure includes an anchor member that has a pair of legs extending downward from a central portion of the anchor member to form an inverted U shape. A spacer is disposed at a lower end portion of each of the pair of legs. The spacers each include a plurality of spacing arms that extend radially at different lengths from an engagement portion of the spacer that adjustably attaches at the anchor member. The engagement portion of the spacer is configured to engage the anchor member in different rotational positions to selectively position a selected one of the plurality of spacing arms in a downward position for accommodating concrete structures with different thicknesses.

According to yet another aspect of the present invention, a method is provided for adjusting a lifting anchor assembly to be embedded in concrete structures with different thicknesses. An anchor member is provided that has a central portion for engaging a lift apparatus, legs that extend downward from the central portion, and cross bars attached at lower end portions of the legs. Spacers are provided that each include multiple spacing arms extending radially at different lengths from an engagement portion of the spacer. A rotational position of the spacers is selected for the engagement portion of the spacers to engage the cross bars and position a selected one of the plurality of spacing arms in a downward position that is configured to position the anchor member at a desired vertical position in a concrete form.

These and other objects, advantages, purposes, and features of the present invention will become apparent upon review of the following specification in conjunction with the drawings.

DETAILED DESCRIPTION OF EMBODIMENTS

Figure 1:
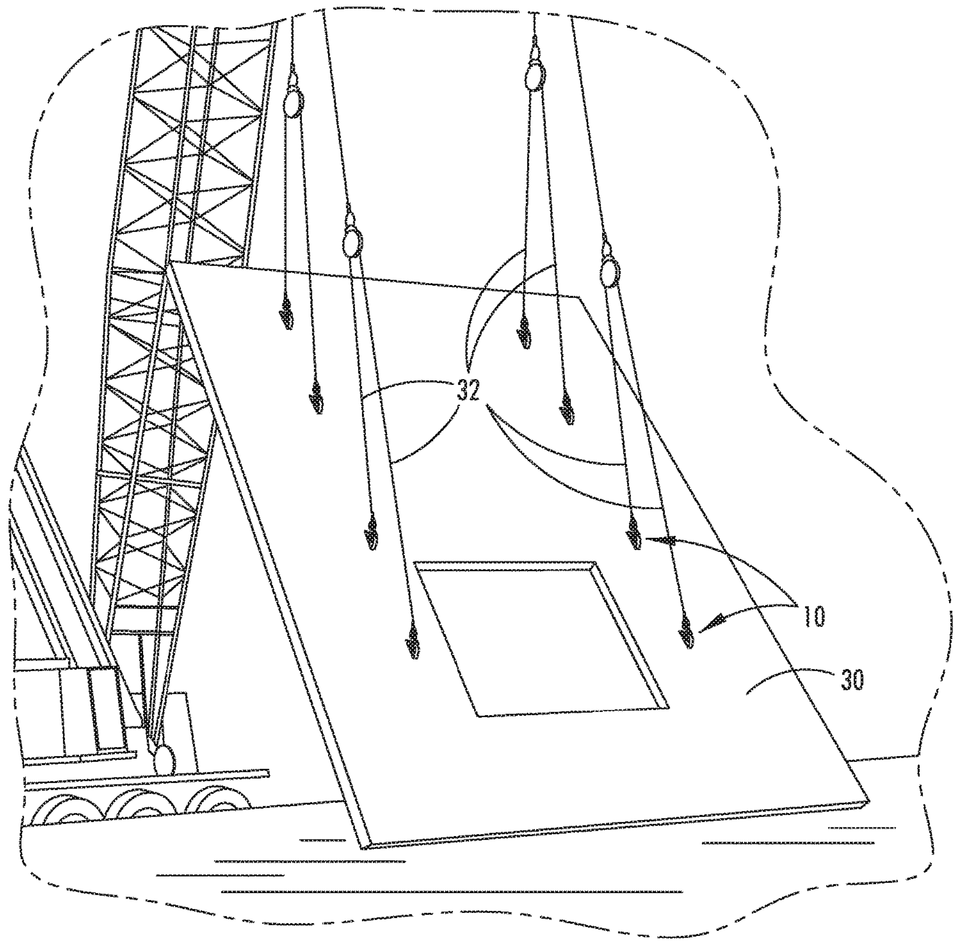
FIG. 1 is a perspective view of a tilt-up, precast concrete structure that is lifted by attaching lift cables to several lifting anchor assemblies.
Figure 2:
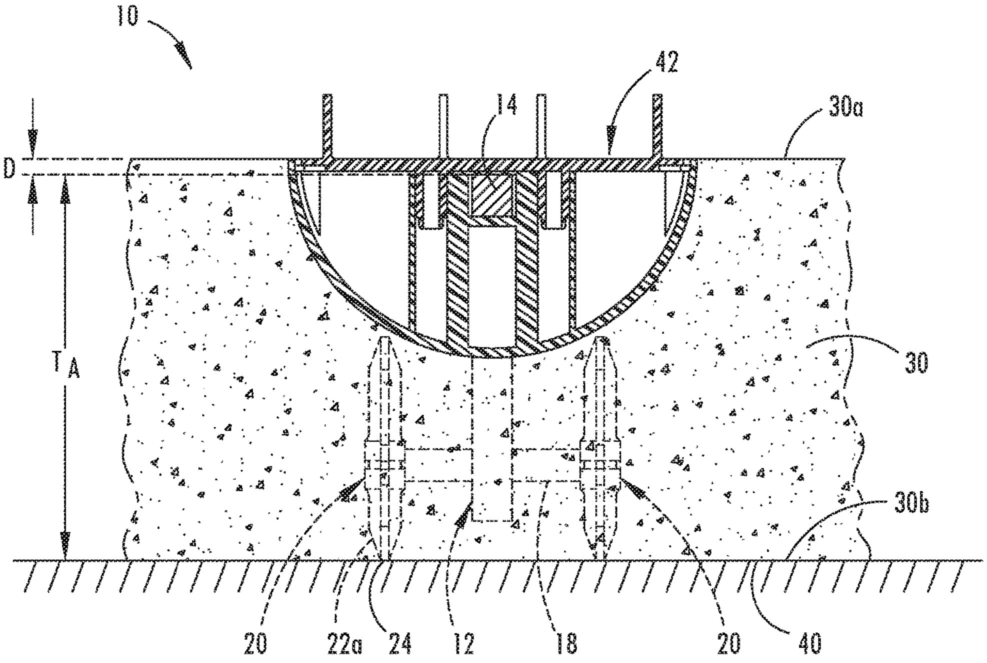
FIG. 2 is a cross-sectional view of a precast concrete structure, taken at line II-II shown in FIG. 4 through a lifting anchor assembly prior to removal of a void former, in accordance with the present invention.
Figure 3:
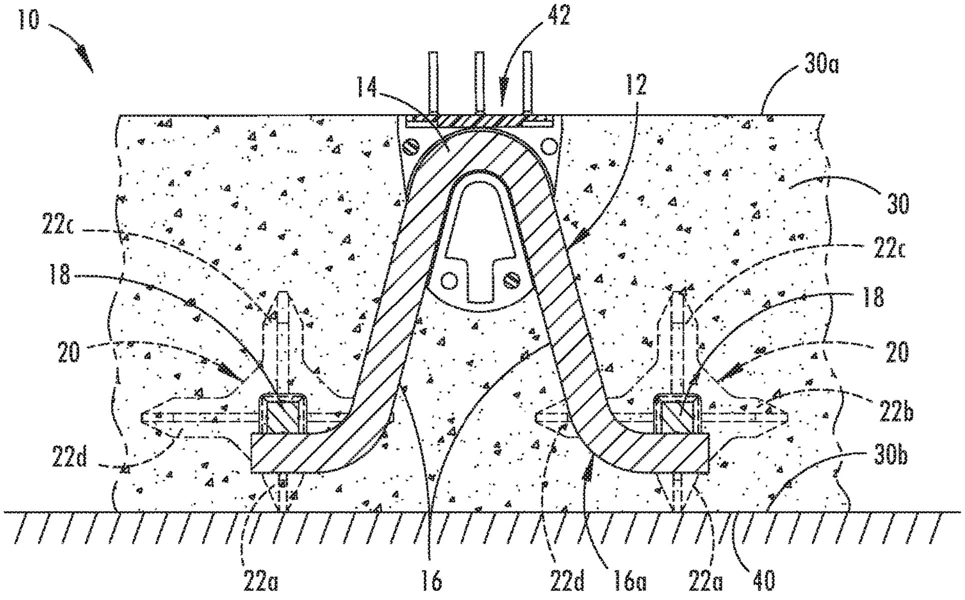
FIG. 3 is a cross-sectional view of the precast concrete structure, taken at line III-III shown in FIG. 4 through the lifting anchor assembly.

Referring now to the drawings and the illustrative embodiments depicted therein, a lifting anchor assembly 10, in accordance with the present invention, is embedded in a tilt-up, precast concrete structure 30 (FIGS. 1-3A) to provide a balanced and secure anchor or attachment point for a lift apparatus 32, such as a chain or cable that may be attached via a lifting clutch or hook or the like. Such an anchor or attachment point provided by the lifting anchor assembly may be used to raise and support the concrete structure 30 when positioning or otherwise moving the concrete structure 30 (FIG. 1). The lifting anchor assembly 10 includes a clevis or anchor member 12 that has a head or central portion 14 configured to engage the lift apparatus 32 and legs 16 that extend downward at an angle from the central portion 14, such as to form an inverted U shape, as shown in FIG. 3. The clevis or anchor member 12 may include cross bars 18 formed or attached at or near lower ends 16*a* of the legs 16. Spacers 20 or feet are disposed at lower end portions of the legs 16, such as at the cross bars 18, where the spacers 20 extend downward from the anchor member 12 to rest on a lower surface 40 of a concrete form (FIGS. 2-3A) for supporting the anchor member 12 upright within a thickness of a concrete structure 30 cast in the concrete form.

Figure 3A:
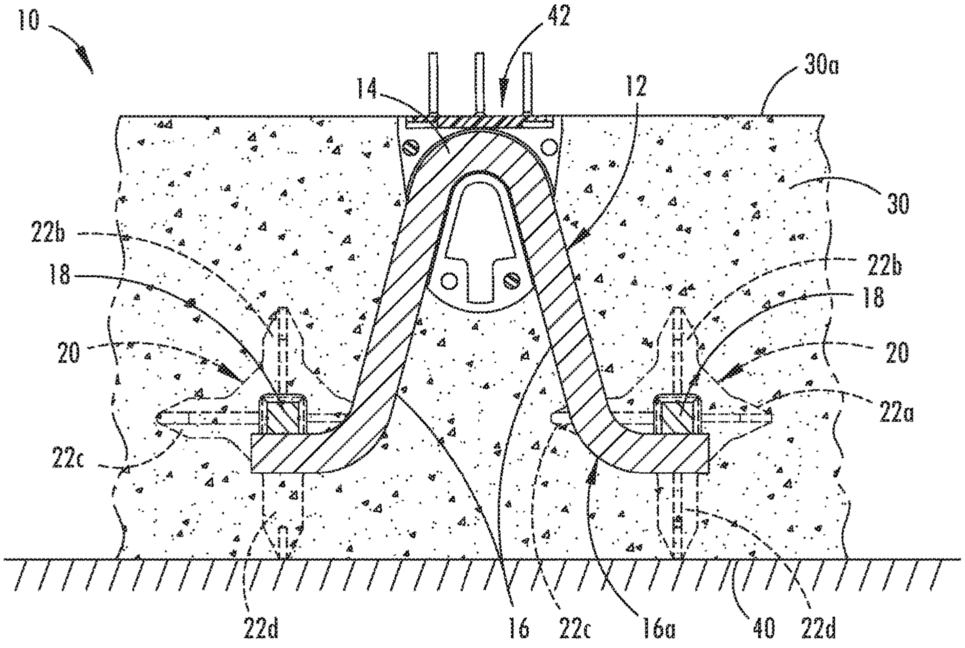
FIG. 3A is a cross-sectional view of an additional embodiment of a tilt-up concrete structure having a larger thickness from that shown in FIG. 3, showing the lifting anchor assembly with the spacers adjusted for accommodating the larger thickness.

As shown in FIGS. 3 and 3A, the spacers 20 may be adjusted to accommodate concrete structures with different thicknesses, such as by providing multiple spacing arms 22 (22*a*, 22*b*, 22*c*, 22*d*) that extend radially at different lengths for positioning one of the arms downward to provide a desired height of the spacer 20. In other words, the spacers 20 may be provided with multiple spacing arms 22 spaced about the spacers 20 with different lengths, such as shown in FIGS. 3 and 3A, where the spacers 20 may engage the anchor member 12 in different rotational positions or orientations relative to the anchor member 12 that selectively position one of the spacing arms 22 in a selected downward position that provides a desired spacing between the anchor member 12 and the lower surface 40 of the concrete form. Thus, the vertical position of the anchor member 12 within a thickness of a concrete structure 30 may be adjusted by rotationally positioning the spacers 20, such as to position the central portion 14 of the anchor member 12 at or near an upper surface 30*a* of the concrete structure 30, as it may be desired for the central portion 14 to be position a selected distance from the upper surface 30*a* to expose it adequately for engaging a lift apparatus, but to not allow it to extend beyond the upper surface 30*a* of the concrete structure.

The adjustment of the spacers 20 allows the lifting anchor assembly 10 to be arranged, such as generally vertically centered, within the thickness of the concrete structure 30. As illustrated in FIG. 2, the anchor thickness TA may be defined between an uppermost surface of the anchor member, shown at the central portion 14, and a lowermost surface of the selected spacing arm, shown at a distal point 24 of the selected arm 22*a*. The anchor thickness may be adjusted to be substantially equal to or less than a thickness dimension of the tilt-up concrete structure 30, such as defined between the illustrated upper and lower surfaces 30*a*, 30*b* generally proximate the embedded lifting anchor assembly 10.

Figure 5:
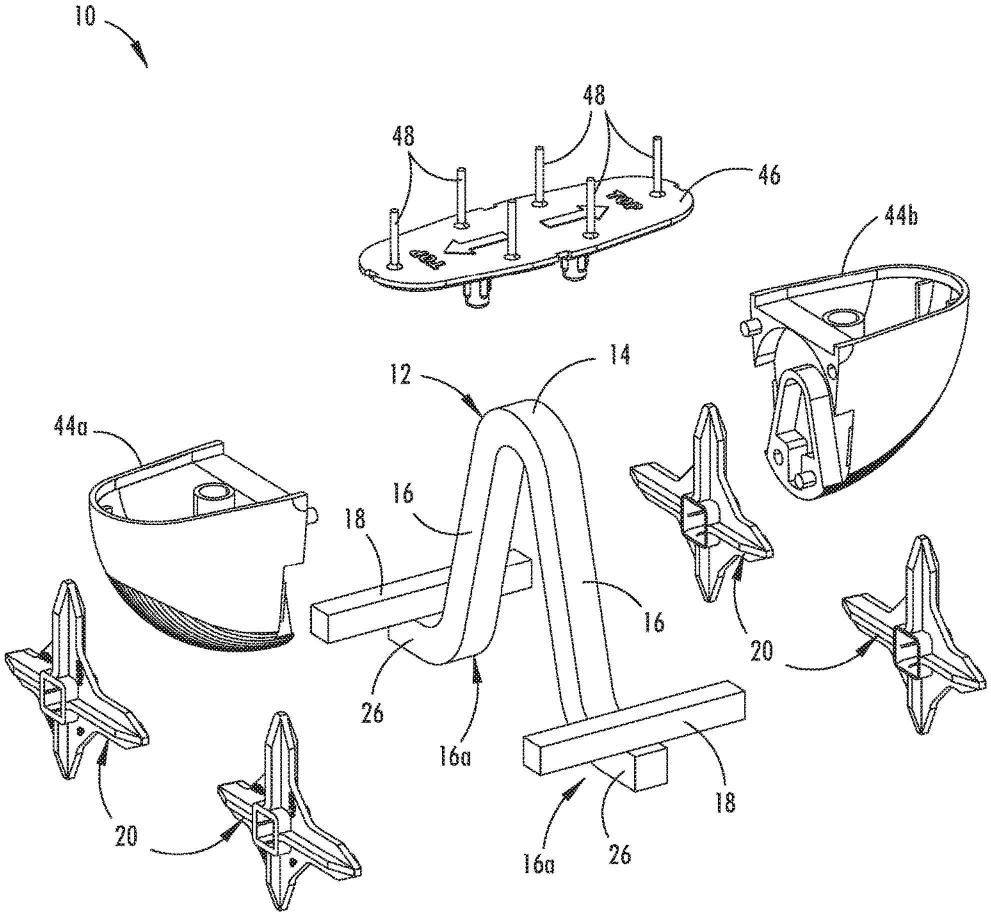
FIG. 5 is an exploded view of the lifting anchor assembly shown in FIG. 4.

The anchor member 12 provides the structural reinforcement and support to lift the concrete structure 30 with the lifting anchor assembly 10 that is embedded in the concrete structure 30. Thus, the anchor member 12 made of a metal, such a comprising a steel or aluminum alloy, and is shaped to provide a loop or attachment point that, when embedded in the concrete structure 30, is resistive to being withdrawn by lifting from the loop or attachment point. As shown in FIG. 5, the attachment point is provided at the central portion 14 of the anchor member 12 with the inverted U shape or clevis shape. A pair of legs 16 of the anchor member 12 extend from the central portion 14 in generally a common plane. The legs 16 are also bent to extend outward horizontally at the lower end portions 16*a* of the legs, also extending within the common plane, to provide a horizontally protruding feature 26 that further assists with preventing withdrawal of the anchor member 12 from the concrete structure 30.

Figure 4:
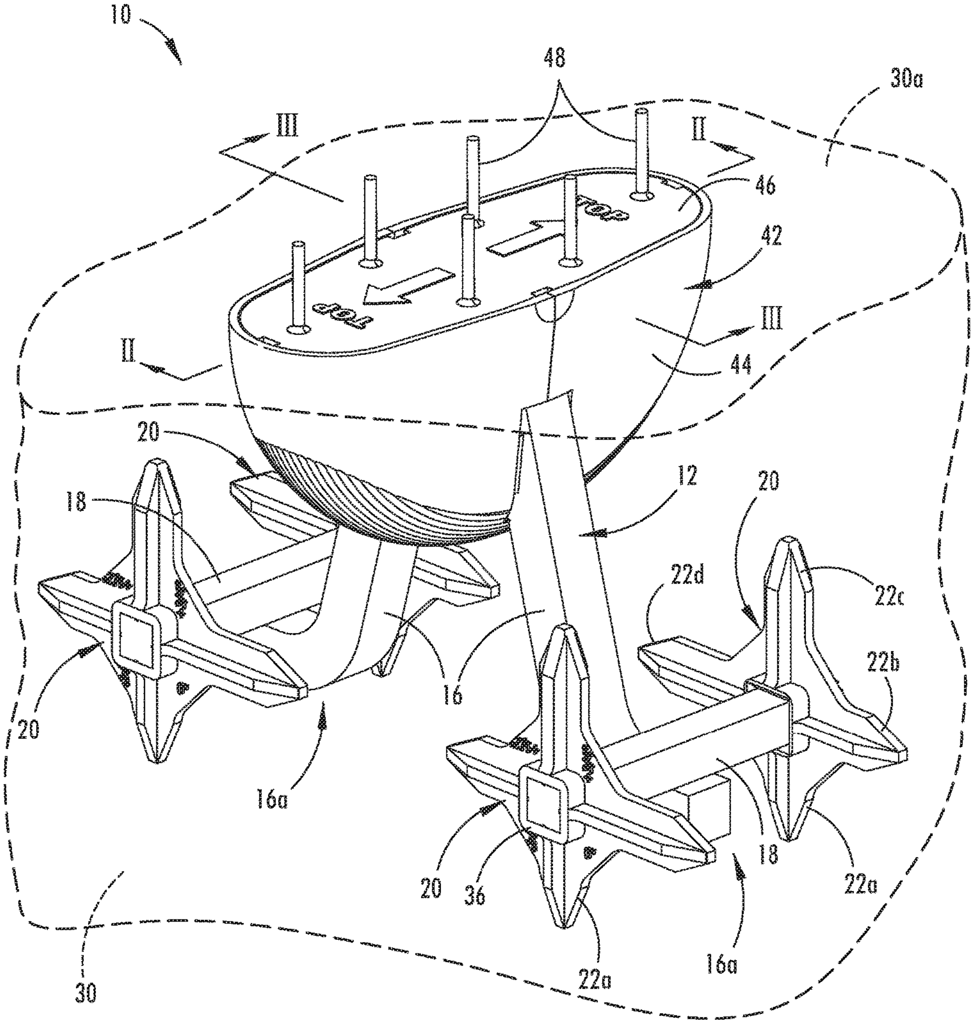
FIG. 4 is an upper perspective view of the lifting anchor assembly shown in FIG. 3.

The lower end portions 16*a* of the pair of legs may also include a cross bar 18, such as shown in FIGS. 4 and 5, which extends generally horizontally from the pair of legs 16 and thereby extending out of the common plane defined by the legs 16 and central portion 14 of the anchor member 12. The cross bars 18 may attach at or be formed on an upward facing surface of the lower portions 16*a* of the legs 16, such that when lifting the concrete structure 30 with the anchor member 12, forces from the lower ends of the legs 16 are transferred upward to the cross members 18 to disperse the lifting forces across more material of the concrete structure 30. The illustrated central portion 14 and legs 16 of the anchor member 12 comprises a single strand or bar stock having a generally square shaped cross section, where the single strand is bent in the common plane to provide the illustrated shape of the central portion 14 and legs 16. Further, the illustrated cross bars 18 are separate pieces of the bar stock with a generally square shaped cross section and an intermediate portion of each piece of bar stock is attached, such as via welding, to the horizontally extending portion of the lower ends of the legs 16. It is contemplated that the anchor member may be formed as a single integral piece and alternatively shaped in additional embodiments, such as for use with differently shaped concrete structures from the illustrated concrete panel.

The spacers 20, which can be adjusted to position the anchor member in the thickness of the concrete structure, are attached at the lower end portions 16*a* of the anchor member 12 to support the anchor member 12 upright and balanced at the desired or selected vertical position in the concrete form. As shown in FIG. 4, four separate spacers 20 are adjustably attached at opposing ends of the cross bars 18, which are positioned on opposing sides of common plane defined by the legs 16 and central portion 14 of the anchor member 12. The opposing ends of the cross bars 18 each include a generally orthogonal cross-sectional shape configured to prevent the spacers 20 from rotating relative to the cross bars 18 when engaged therewith, such as to hold the spacers 20 in the selected orientation relative to the anchor member 12. It is contemplated that more or fewer spacers may be attached to the anchor member, such as to accommodate differently shaped or configured anchor members or concrete structures.

Figure 6:
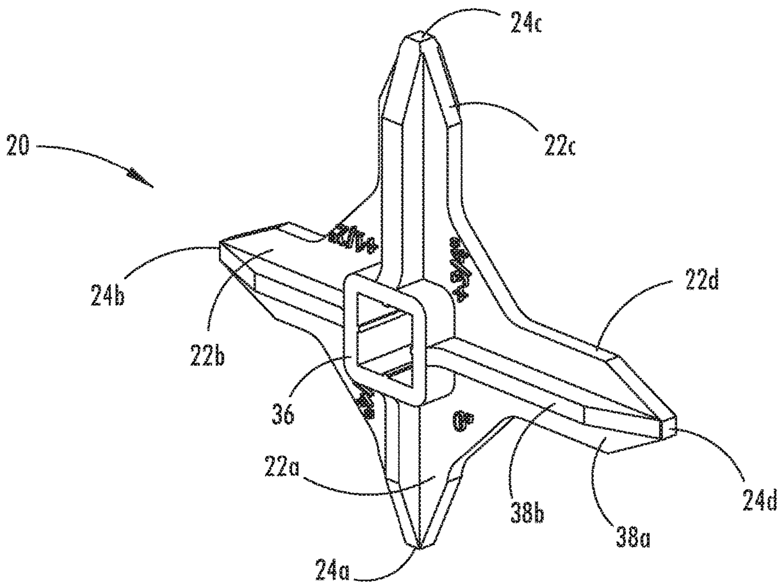
FIG. 6 is an upper perspective view of a spacer of the lifting anchor assembly shown in FIG. 5.
Figure 7:
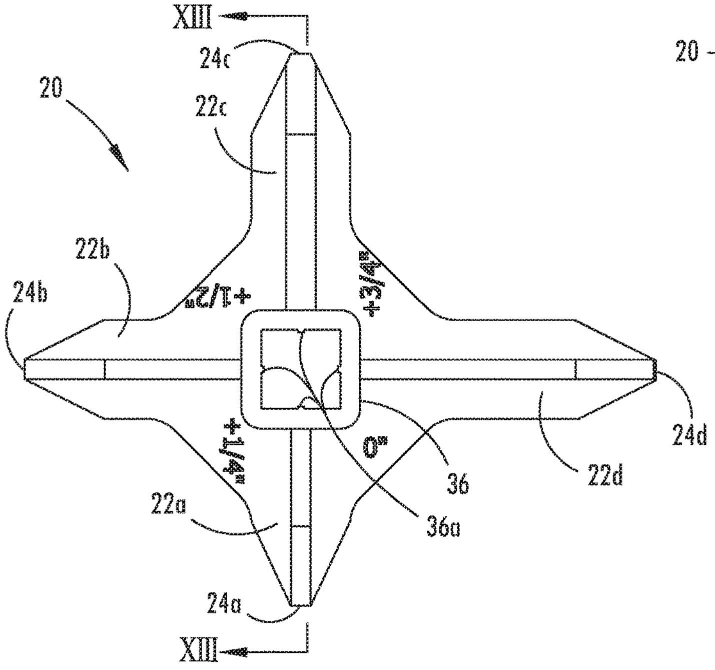
FIG. 7 is an elevational view of the spacer shown in FIG. 6.
Figure 8:
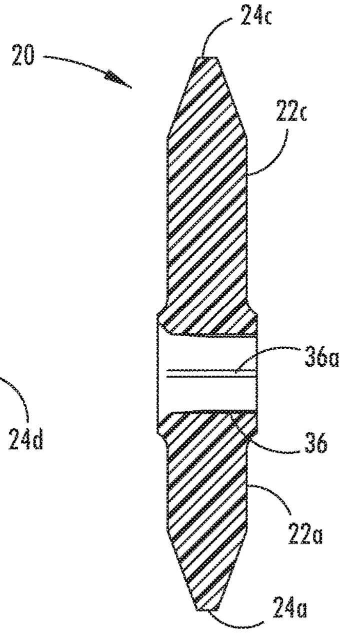
FIG. 8 is a cross-sectional view of the spacer, taken at line XIII-XIII of FIG. 7.

As shown in FIGS. 6-8, each spacer 20 includes a plurality of spacing arms 22 (22*a*, 22*b*, 22*c*, 22*d*) that extend radially from the spacer 20 at different radial lengths to form a generally star shape. The spacers 20 are configured to be positioned relative to the anchor member 12 at a selected orientation that selectively positions one of the spacing arms 22 in a downward position, such as arm 22*a* in FIG. 3 and arm 22*d* in FIG. 3A. The selected arm in the downward position provides the selected spacing of the anchor member 12 from a lower surface 40 of a concrete from to accommodate a thickness of the concrete structure 30. The spacers 20 each include a hub or engagement portion 36 that adjustably engages the anchor member 12 in the selected orientation. The illustrated engagement portion 36 provides a rectangular hole for slip-attachment onto the ends of the cross bars 18 (FIGS. 2-3), so that a spacing arm 22 (22*a* or 22*b* or 22*c* or 22*d*) of desired length extends in a direction (downwardly) away from the U-shaped central portion 14 of the anchor member 12. The illustrated engagement portion 36 has ribs 36*a* that protrude radially into the rectangular hole, such that the ribs 36*a* are configured to resiliently compress or elastically deform to provide a tight friction fit when the spacers 22 are slipped on to and into engagement with the ends of the cross bars 18. Thus, the spacers may comprise a polymeric material, such as being formed by an injected molded plastic or the like.

With further reference to FIGS. 6-8, the spacing arms 22 extend radially from generally equally spaced locations about the circumference of the engagement portion 36, such as shown extending orthogonally outward from each of the flat surfaces of the square-shaped hole, this in opposite direction from the respective rib 36*a*. The spacing arms 22 are provided in different lengths, such as shown with each arm being ¼" to 1" longer than an adjacent arm and the arms being progressively larger by a consistent dimensional increment, such as shown with the indicia of 0", +¼", +½", +¾" to indicate the respective increase in spacing distance. Thus, the illustrated arm 22*b* is about ¼" longer than the adjacent arm 22*a* and the same for each successive arm until arriving back at arm 22*a*, which is designated as 0" for the baseline or minimum spacing. Also, the illustrated arms 22 are each formed by two intersecting orthogonal walls 38*a*, 38*b* (FIG. 6) to provide a plus-shaped cross section, where the arms 22 taper to a distal point or line 24 (or 24*a*, 24*b*, 24*c*, 24*d* for the respective arms) that resembles the shape of a Phillips head screwdriver. However, other shapes and other incremental dimensional length changes are contemplated to be within a scope of the present invention. By placing a star-shaped spacer 22 onto the cross bar 18 in a selected rotational orientation, the present assembly can accommodate a variety of different thicknesses of the precast concrete structures. The lifting anchor assembly 10 provides a balanced anchor support and defines a desired total thickness TA dimension from an uppermost surface of the clevis or anchor member 12 to a lowermost surface of the spacing arm 22 (depending on which faces downwardly). This allows the assembly 10 (using a same set of components) to be used to successfully cast several different thickness tilt-up concrete structures.

The central portion 14 of the anchor member 12 is configured, when cast in a concrete structure, to be spaced a set distance D (FIG. 2) from an upper surface 30*a* of the concrete structure 30 for being exposed to engage a lift apparatus, while not extending beyond the upper surface 30*a* to interfere with the resulting structure. Thus, the spacers 20 are configured to rest on a lower surface 40 of a concrete form to support the anchor member at a vertical position that embeds the anchor member 12 with the central portion 14 disposed at the set distance D from the upper surface 30*a* of the concrete structure 30 cast in the concrete form. To allow the central portion 14 to be exposed after forming the concrete structure, the lifting anchor assembly 10 is cast within a thickness of the concrete structure 30 with a cap or void former 42 (FIGS. 2-4) engaged with the anchor member 12 to conceal the central portion 14 of the lifting anchor assembly 10. As shown in FIGS. 2-3A, the concrete structure 30 is cured or hardened (from wet/fluid concrete with the structure being laid on the ground or lower surface of the concrete form) with the void former attached, and when cured and hardened, the void former 42 may be removed to provide a cavity at the upper surface 30*a* of the concrete structure 30 that exposes the central portion 14 of the anchor member 12. The void former 42 includes a two-piece shell 44 that has a rounded convex exterior surface that forms the cavity at the upper surface 30*a*. The shell 44 is divided into two pieces 44*a*, 44*b* that each provide an outer surface that approximately forms a half or 90 degrees of the cavity.

The shell 44 of the void former 42 has a thin-walled generally-hollow polymeric body formed by the opposing halves 44*a* and 44*b*. The halves 44*a*, 44*b* mate together and are secured together by a top plate or cover 46 that engages a top of the shell 44. The cover 46 also prevents overspill into the, otherwise exposed interior, of the shell 44 during the concrete pouring stages of the tilt-up, precasting process or when inserting the lifting anchor assembly 10 into a wet bed of concrete. The illustrated cover 46 includes upwardly-extending protruding rods 48 that form handles to facilitate removal of the cover 46 after the wet concrete is sufficiently cured and there is no need for the hollow shell 44 to continue to be covered. The shell halves 44*a*, 44*b* thus form a protected sealed-off area under an engagement portion of the inverted U-shaped center 14. This is done to prevent intrusion of wet concrete, so that the area remains open and can receive a lift apparatus, such as a chain, cable, or hook or the like, that is extended under the central portion to facilitate lifting of the precast concrete structure 30.

Figure 9:
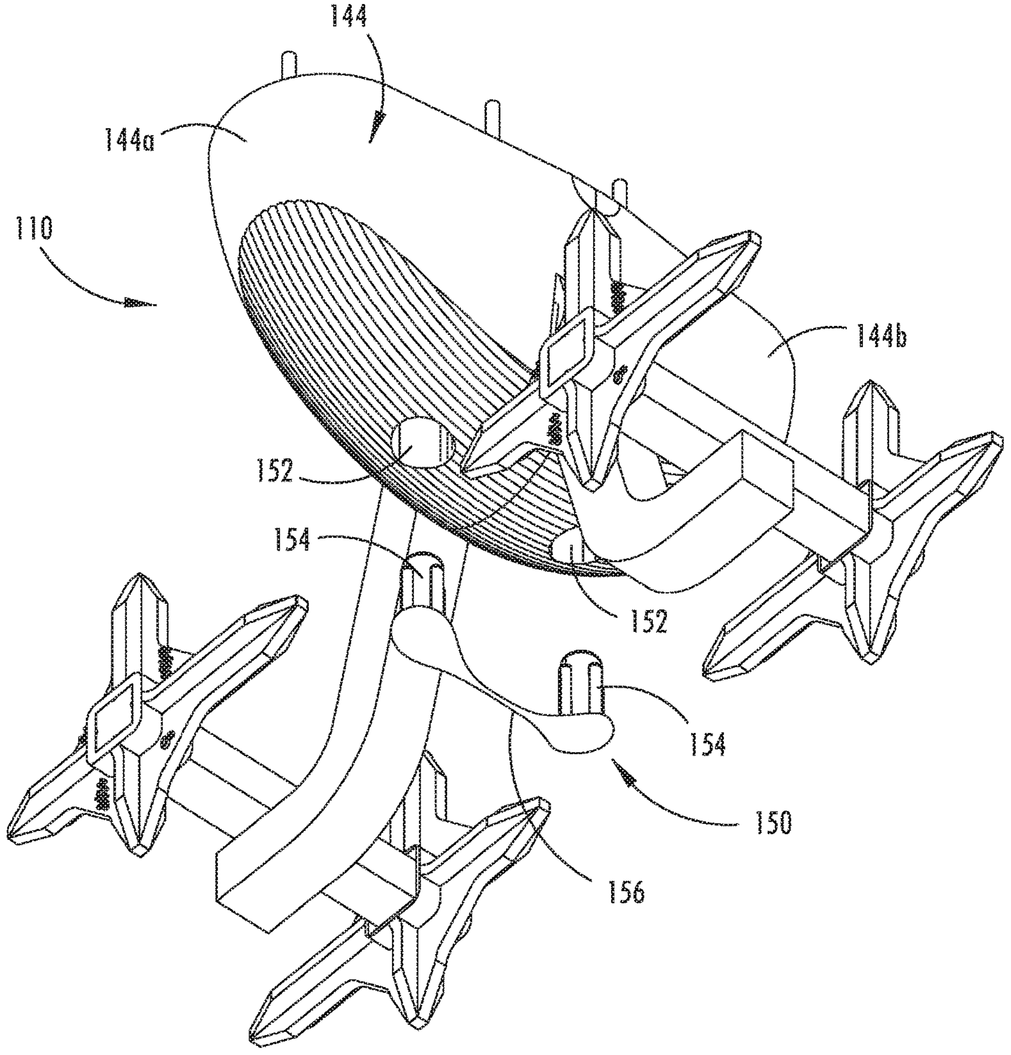
FIG. 9 is a lower perspective view of an additional embodiment of a lifting anchor assembly that has a tie connector exploded from the void former.

Optionally, such as shown in an additional embodiment of the lifting anchor assembly 110 illustrated in FIG. 9, a tie component 150 may be provided to also attach to the halves 144*a*, 144*b* to close the hollow sealed-off area provided by the shell 144 and thus assists with preventing undesired intrusion by wet concrete into the shell 144 during early stages of the precast process for making the concrete structure. The tie component 150 may also include plug portions 154 to be fit within and seal off bottom openings 152 defined in a bottom of the shell 144. The tie component 150 may comprise an elastomeric or flexible material, such as a polymer or rubber or the like, that allows plug portions 154 to be tightly fit within the bottom openings 152 and for a strap portion 156 of the tie component 150 that interconnects the plug portions 154 to flex and stretch. Other features of the illustrated lifting anchor assembly 110 are otherwise the same as those described above with reference to FIGS. 1-8. It is further contemplated that the void former may include various alternative shapes and configurations in other embodiments of the lifting anchor assembly.

A method related to the above, such as for adjusting a lifting anchor assembly configured to be embedded in a precast concrete structure, includes placing the spacers onto the anchor member to achieve an adjustable anchoring system that can accommodate different thickness precast concrete structures, even while the anchoring system uses all of the same components. The method may include selecting a rotational position of the spacers for the engagement portion of the spacers to engage the cross bars and to position a selected one of the spacing arms in a downward position that is configured to position the anchor member at a desired vertical position in the concrete form. The selected spacing arm in the downward position is configured to rest on a lower surface of the concrete form to support the anchor member at a spaced distance from a lower surface of the concrete to embed the anchor member within a thickness of the concrete structure cast in the concrete form. The method may further provide detachably engaging the void former around the central portion of the anchor member, such that after the concrete structure is hardened, the void former is removed to provide a cavity at the upper surface of concrete structure that exposes the central portion of the anchor member.

For purposes of this disclosure, the terms "upper," "lower," "right," "left," "rear," "front," "vertical," "horizontal," and derivatives thereof shall relate to the invention as oriented in FIG. 2. However, it is to be understood that the invention may assume various alternative orientations, except where expressly specified to the contrary. It is also to be understood that the specific devices and processes illustrated in the attached drawings, and described in this specification are simply exemplary embodiments of the inventive concepts defined in the appended claims. Hence, specific dimensions and other physical characteristics relating to the embodiments disclosed herein are not to be considered as limiting, unless the claims expressly state otherwise.

Changes and modifications in the specifically described embodiments may be carried out without departing from the principles of the present invention, which is intended to be limited only by the scope of the appended claims as interpreted according to the principles of patent law. The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

The invention claimed is:

1. A lifting anchor assembly configured to be embedded in a tilt-up concrete structure, said lifting anchor assembly comprising:

an anchor member having an upper portion configured to engage a lift apparatus and a plurality of legs that extend downward from the upper portion;

a plurality of spacers disposed at lower end portions of the plurality of legs, wherein the plurality of spacers each include a plurality of spacing arms that extend radially from the spacer at different radial lengths; and wherein the plurality of spacers are configured to be engaged at the anchor member in a selected orientation to position one of the plurality of spacing arms in a downward position for contacting a lower surface of a concrete form to support the anchor member upright and at a corresponding selected spacing of the anchor member from the lower surface of the concrete form.

2. The lifting anchor assembly of claim 1, wherein the plurality of legs extend from the upper portion in generally a common plane.

3. The lifting anchor assembly of claim 2, wherein the lower end portion of each of the plurality of legs includes a cross bar that extends out of the common plane of the plurality of legs, and wherein the plurality of spacers attach at opposing ends of the cross bars.

4. The lifting anchor assembly of claim 1, wherein the plurality of spacing arms extend from circumferentially spaced locations about a periphery of each spacer.

5. The lifting anchor assembly of claim 1, wherein the plurality of spacers each include an engagement portion that adjustably engages the anchor member in the selected orientation.

6. The lifting anchor assembly of claim 1, wherein the anchor member includes a cross bar supported at the lower end portions of each of the plurality of legs, and wherein the plurality of spacers are attached at the cross bars.

7. The lifting anchor assembly of claim 6, wherein the plurality of spacers are configured to engage opposing ends of the cross bars, and wherein the plurality of spacers are configured to engage the cross bars at the selected orientation that provides the corresponding selected spacing of the anchor member from the lower surface of the concrete to accommodate different thickness concrete structures.

8. The lifting anchor assembly of claim 1, further comprising a void former configured to detachably engage the upper portion of the anchor member, wherein the void former comprises a shell that is configured to be cast into the concrete structure and, after the concrete structure is hardened, removed to provide a cavity at an upper surface of the concrete structure that exposes the upper portion of the anchor member.

9. A lifting anchor assembly configured to be embedded in a tilt-up concrete structure, said lifting anchor assembly comprising:

an anchor member having a pair of legs that extend downward from a central portion of the anchor member to form an inverted U shape;

a spacer disposed at a lower end portion of each of the pair of legs, wherein the spacers each include a plurality of spacing arms that extend radially at different lengths from an engagement portion of the spacer that adjustably attaches at the anchor member; and wherein the engagement portion of the spacer is configured to engage the anchor member in different rotational orientations to correspondingly position a selected one of the plurality of spacing arms in a downward position for accommodating concrete structures with different thicknesses.

10. The lifting anchor assembly of claim 9, wherein the central portion of the anchor member is configured, when cast in a concrete structure, to be spaced a set distance from an upper surface of the concrete structure for being exposed to engage a lift apparatus.

11. The lifting anchor assembly of claim 10, wherein a distal portion of the selected spacing arm in the downward position is configured to rest on a lower surface of a concrete form to support the anchor member at a spaced distance from the lower surface to embed the anchor member with the central portion disposed at the set distance from the upper surface of the concrete structure cast in the concrete form.

12. The lifting anchor assembly of claim 9, wherein an anchor thickness is defined between an uppermost surface of the anchor member to a lowermost surface of the selected spacing arm, and wherein the anchor thickness is configured to be substantially equal to or less than a thickness dimension of a tilt-up concrete structure.

13. The lifting anchor assembly of claim 12, wherein the spacers are adjustably attach at opposing ends of a cross bar coupled with each of the pair of legs, and wherein the opposing ends of the cross bars each include a generally orthogonal cross-sectional shape configured to prevent the spacers from freely rotating relative to the cross bars when engaged therewith.

14. The lifting anchor assembly of claim 9, further comprising a void former configured to detachably engage the central portion of the anchor member, wherein the void former is configured to be cast into an upper portion of the concrete structure and, after the concrete structure is hardened, removed to provide a cavity at the upper surface of the concrete structure that exposes the central portion of the anchor member for engaging a lift apparatus.

15. The lifting anchor assembly of claim 9, wherein the plurality of spacing arms extend from circumferentially spaced locations on the engagement portion of the spacer.

16. A lifting anchor assembly configured to be embedded in a tilt-up concrete structure, said lifting anchor assembly comprising:

an anchor member having an upper portion configured to engage a lift and a lower portion configured to be embedded in a tilt-up concrete structure cast in a horizontal form;

a spacer having an engagement portion attached at the lower portion of the anchor member, wherein the spacer has an outer periphery that is spaced radially at different lengths from the engagement portion of the spacer; and wherein the spacer is configured to be oriented relative to the anchor member at a selected rotational orientation to position a selected section of the outer periphery downward for contacting a base surface of the horizontal form to space the anchor member away from the base surface at a desired height to accommodate a thickness of the tilt-up concrete structure.

17. The lifting anchor assembly of claim 16, wherein the lower portion of the anchor member comprises a pair of legs that extend downward from the upper portion of the anchor member to form an inverted U shape.

18. The lifting anchor assembly of claim 16, wherein the outer periphery of the spacer comprises a plurality of spacing arms that extend radially at different lengths from the engagement portion.

19. The lifting anchor assembly of claim 16, wherein the selected section of the outer periphery comprises a spacing arm, and wherein a distal portion of the spacing arm is oriented downward to rest on the base surface of the concrete form to support the anchor member at the desired height.

* * * * *